(12) United States Patent
Doan

(10) Patent No.: US 6,376,369 B1
(45) Date of Patent: Apr. 23, 2002

(54) ROBUST PRESSURE ALUMINUM FILL PROCESS

(75) Inventor: Trung T. Doan, Boise, IA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/022,568

(22) Filed: Feb. 12, 1998

(51) Int. Cl.$^7$ .......................................... H01L 21/4763

(52) U.S. Cl. .................. 438/643; 438/618; 438/637; 438/653; 438/687; 438/688

(58) Field of Search ................................ 438/643, 652, 438/653, 667, 687, 688, 430, 618, 622, 637, 642, 624; 257/751

(56) References Cited

U.S. PATENT DOCUMENTS

| | | | |
|---|---|---|---|
| 4,999,160 A | * 3/1991 | Lowrey et al. | 420/529 |
| 5,136,362 A | * 8/1992 | Grief et al. | 257/751 |
| 5,242,860 A | 9/1993 | Nulman et al. | 437/190 |
| 5,278,449 A | 1/1994 | Miyakawa | 257/765 |
| 5,312,772 A | 5/1994 | Yokoyama et al. | 437/190 |
| 5,341,026 A | 8/1994 | Harada et al. | 257/774 |
| 5,371,042 A | 12/1994 | Ong | 437/194 |
| 5,420,072 A | 5/1995 | Fiordalice et al. | 437/192 |
| 5,527,561 A | * 6/1996 | Dobson | 427/383.3 |
| 5,534,463 A | 7/1996 | Lee et al. | 437/195 |
| 5,545,592 A | 8/1996 | Iacoponi | 437/200 |
| 5,567,987 A | 10/1996 | Lee | 257/765 |
| 5,691,571 A | 11/1997 | Hirose et al. | 257/771 |
| 5,913,145 A | * 6/1999 | Lu et al. | 438/643 |
| 5,932,289 A | * 8/1999 | Dobson et al. | 427/383 |

OTHER PUBLICATIONS

Robert Weast "CRC Handbook of Chemistry and Physics", pp. D185–D186, Aug. 2, 1989.*
Dixit et al. "An Integrated Low Resistance Aluminum Plug and Low–K Polymer Dielectric For High Performance 0.25 microns Interconnection", IEEE, pp. 86–87, 1996.*
Dixit et al. "A Novel High Pressure Low Temperature Aluminum Plug Technology for Sub–0.5 microms Contact/Via Geometries", IEEE, pp. 5.3.1–5.3.4, Dec. 1994.*
Dixit et al. "A Novel 0.25 microns Via Plug Process Using Low Temperature CVD Al/TiN", IEDM, pp. 10–7.1–10.7.3, Dec. 1995.*
Mizobuchi et al. "Application of Force Fill Al–Plug technology to 64Mb DRAM and 0.35 microns Logic", VLSI, pp. 45–46, Jun. 6, 1995.*
Kikuta, et al., "Al–Ge Reflow Sputtering for Submicron–Contact–Hole Filling," Jun. 11–12, 1991 VMIC Conference, 1991 IEEE.

* cited by examiner

Primary Examiner—Carl Whitehead, Jr.
Assistant Examiner—Maria Guerrero
(74) Attorney, Agent, or Firm—Workman, Nydegger & Seeley

(57) ABSTRACT

A method of metallization for a semiconductor channel, trench, or via with a high aspect ratio lined with a barrier metal layer. The channel, trench, or via is situated in a semiconductor substrate and the barrier metal layer has deposited thereon two metal layers, the first of which has a lower melting point by at least 10° C. than that of the second. A low temperature, high pressure process is used to alloy together the two uppermost metal layers and bond them to a barrier metal, and thereby substantially fill up the channel, trench, or via without leaving a void therein and without breaching the barrier layer in a pitting phenomenon.

45 Claims, 4 Drawing Sheets

ROBUST PRESSURE ALUMINUM FILL PROCESS

BACKGROUND OF THE INVENTION

1. The Field of the Invention

The present invention is directed to a method for manufacturing a semiconductor substrate having thereon a multilayer structure with a substantially completely filled trench, channel, or via using a robust, pressure aluminum fill process. More particularly, the invention relates to methods of manufacturing a semiconductor device on a semiconductor substrate having a trench, channel, or via that is coated with a barrier layer and where a metallization layer on the barrier layer substantially completely fills up the trench, channel, or via.

2. The Relevant Technology

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. Used of the term "semiconductor substrate" herein also includes structures such as silicon-on-insulator and silicon-on-sapphire.

Various interconnection layers are formed on semiconductor substrates for electrically connecting elements thereon to each other as well as to external circuits. These interconnection layers are typically formed of polysilicon films, high melting point metal films, high melting point metal silicide films, aluminum films, and aluminum alloy films. In recent years, reduction of the interconnection layer resistivity has been desirable in semiconductor integrated circuit devices which are highly integrated for high speed operation. Where aluminum interconnection structures are used, the semiconductor integrated circuit devices having aluminum interconnection structures are preferably formed of aluminum films or aluminum alloy films that have a small resistivity. Poor step coverage of an aluminum film used to fill a trench, channel, or via, and the consequent creation of a voids within the trench, channel, or via, is overcome by using a high temperature, high pressure treatment. A difficulty with this process is that the steps taken to eliminate voids in the trench, channel, or via also undermine the integrity of the barrier layer.

In integrated circuit manufacture, it is often desirable to accomplish a multi-level metallization scheme. Achieving an optimally high integrated circuit density can be accomplished by arranging conductive connections between individual electrical elements of an integrated circuit in planes lying above one another and to simultaneously miniaturize the lateral dimensions of structures within a plane. Such a multi-level metallization scheme requires level-penetrating contacts that are high-speed conductors and have good electromigration resistance and stress migration resistance.

The filling of a channel, via, or trench is made more difficult when the channel, via, or trench has a high aspect ratio, where aspect ratio is defined as height of the channel, via, or trench divided by the width thereof.

FIG. 1 depicts a semiconductor substrate 10 and a recess 12. Recess 12 can be a channel, via, or trench. In FIG. 2, a barrier layer 14 has been deposited within recess 12. For filling recess 12, a layer of aluminum or aluminum alloy 16 is deposited by physical or chemical vapor deposition, respectively, PVD and CVD. The CVD and PVD processes are typically conducted at a pressure of about 3 mTorr.

Barrier layer 14 is present to prevent the interdiffusion of silicon in semiconductor substrate 10 with the aluminum or aluminum alloy layer 16. Preferably, diffusion barrier 14 is formed of titanium nitride or titanium/tungsten, and is preferably situated between semiconductor substrate 10 and aluminum or aluminum alloy layer 16. A titanium nitride film is preferable in that it can promote the preferential development of a (111)-texture in an aluminum film that is subsequently deposited, which increases its physical stress and electromigration resistance. In addition to serving as a barrier material, titanium nitride films can also serve as an adhesive between semiconductor substrate 10 and aluminum or aluminum alloy layer 16.

FIG. 3 illustrates how aluminum or aluminum alloy layer 16 produced in this manner has poor step coverage for a high aspect ratio structure. Poor step coverage in a high aspect ratio structure is evinced by the "breadloafing" effect that is seen in FIG. 3, where an overhang partially obscures the opening to recess 12 so as to cause a void therein. The presence of a void in recess 12, seen in FIGS. 3 and 4, detrimentally effects conductivity of aluminum or aluminum alloy layer 16. Improved step coverage of aluminum or aluminum alloy layer 16 within recess 12 is therefore desirable for reasons of electrical reliability. Additionally, improved metal flow and rapid elimination of voids with recess 12 without a weakening of barrier layer 14 is also desirable.

Due to the problem of poor or marginal step coverage in recess 12 and the creation of a void therein, aluminum or aluminum alloy layer 16 must be subjected to further treatment, for example by flowing of aluminum or aluminum alloy layer 16 by a heat treatment of brief duration such as rapid thermal processing (RTP), in combination with high pressure. If further structures are to be deposited on aluminum or aluminum alloy layer 16, then a height difference may result which must be compensated with a subsequently applied, non-conductive layer. A further difficulty arises when aluminum or aluminum alloy layer 16 is exposed to air. This exposure leads to the creation of a passivating layer containing aluminum oxide, which makes aluminum or aluminum alloy layer 16 less likely to flow adequately.

The prior art process to eliminate a void in a recess 12 using a combination of high pressure and high temperature creates a problem in that it may leave the barrier layer in a compromised state, as seen in FIG. 5. The deposition of aluminum or aluminum alloy layer 16 is typically at a pressure of about 3 mTorr, such that a void left in recess 12 has a pressure of about 3 mTorr which will typically collapse under typical RTP temperatures at a pressure of about 700 atmospheres. The atmosphere in which the high pressure is supplied is selected from a group of fluids that are inert to the device being built but have elemental or molecular diameters that will not penetrate the upper surface of the metallization layer which is seen in FIG. 3 as aluminum or aluminum alloy layer 16.

FIG. 5A depicts an enlarged view of FIG. 5, and particularly a region 20 which illustrates a potential result of the prior art process. The prior art high temperature RTP method described above tends to weaken barrier layer 14 so as to cause a breach 30 therein. Breach 30 permits the silicon of semiconductor substrate 10 to dissolve with aluminum or aluminum alloy layer 16.

RTP treatment, when used to eliminate a void in recess 12, tends to disrupt the crystallography of the titanium nitride film of barrier layer 14 as well as the preferential development of a (111)-texture in aluminum or aluminum alloy layer 16 that is subsequently deposited. While temperatures in excess of 450° C. are required to initiate flowability of aluminum, a weakening of barrier layer 14 occurs above 450° C. The melting point of aluminum begins to be evidenced at about 660° C. With the weakening of barrier layer 14, the problem of junction spiking occurs if aluminum or aluminum alloy layer 16 becomes connected to a semiconductor substrate that contains silicon or polysilicon. Because of the solubility of silicon in aluminum, silicon diffuses into the aluminum conductor and precipitates out again at a later time. As a result, electrical leakage occurs from barrier layer 14 at breach 30. FIG. 5A depicts breach 30 where continued dissolution of silicon into the aluminum has created an enlargement of beach 30 at the base of the void within recess 12. Eventually, continued electrical leakage and the growing of the pit at the base of the void within recess 12 will destroy an electrical contact thereat and an a device associated therewith will fail. Electrical leakage alone will cause pure aluminum to electromigrate and, over time, an aluminum metal line will tend to thin out and become discontinuous due to electron crowding.

SUMMARY OF THE INVENTION

The present invention is drawn to a method of filling up a recess in a semiconductor substrate. Example of such as a recess are a channel, via, or trench. The filling of the recess eliminate voids therein. In the method, a barrier layer is formed within the recess. A first metal layer having a first melting point is then formed upon the barrier layer. The semiconductor substrate is then exposed to a selected pressure and a selected temperature sufficient to fill up the recess with the first metal layer. A second metal layer is formed upon the first metal layer, where the second metal layer has a melting point that is greater than that of the first metal layer. Preferably, the second metal layer has a melting point that is at least 10° C. greater than that of the first metal layer, and most preferably at least 25° C. greater.

In an alternative embodiment, there is deposited in the channel, via, or trench a barrier layer. Then, at least two aluminum alloy layers are deposited on the barrier layer. The at least two aluminum alloy layers may also be heat and pressure conditioned after deposition of the same. In so doing, the semiconductor structure and barrier layer, each of which underlies the channel, via, or trench, are not damaged. Preferably, the barrier layer is substantially composed of titanium nitride. A layer titanium may be deposited in the channel, via, or trench prior to the barrier layer.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 1 through 5A illustrate a method of the filling up of a channel, via, or trench used in the prior art, wherein FIG. 1 shows the channel, via, or trench to be filled, FIG. 2 shows a barrier layer within the channel, via, or trench, FIG. 3 shows an aluminum layer over the barrier layer having a void formed therein, FIG. 4 shows the void within the channel, via, or trench after a high pressure and low temperature step, and FIG. 5 shows the diffusion of silicon of a silicon substrate below the channel, via, or trench into the aluminum layer so as to breach the barrier layer 14 in a pitting phenomenon. FIG. 5A depicts an enlarged view of the breach of the barrier layer.

FIGS. 6 through 8 illustrate a structure resulting from the inventive method of the filling of a channel, via, or trench used in the present invention wherein a plurality of aluminum alloy layers are employed to fill up the channel, via, or trench in a first preferred alternative process, wherein FIG. 6 shows a semiconductor structure having therein a trench, channel, or via with a barrier layer therein covered by a first metal alloy having a first melting point and a second metal alloy over the first metal alloy having a second melting point greater than that of the first metal alloy.

DETAILED DESCRIPTION OF THE PREFERRED EMBODIMENTS

Figure 6:
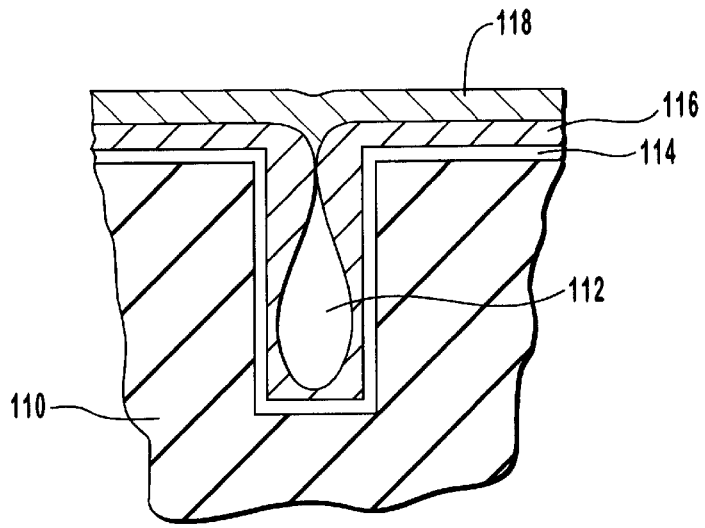

In FIG. 6 a barrier layer 114 is depicted. Barrier layer 114 can be deposited in a CVD process that employs a nitrogen-containing, organic titanium compound. The titanium compound, as an initial substance, is thermally, optically or plasma-excited in the CVD process. Given purely thermal excitation, the titanium compound can provide for the addition of a reduction agent. The inventive method can deposit a titanium nitride layer having especially advantageous properties, including conformity, low stress, good step coverage, high barrier effect, and good conductivity.

In the CVD, preferred substances for applying a barrier layer are: $Ti(NR_2)_4$ and $Ti(NHR)_4$, where R represents alkyl aryl or $CF_3$, and $Ti(NR_2)_2R'_2$, where R represents alkyl, and R' represents alkyl, aryl or $CF_3$. The titanium-nitrogen ratio and the short range order of the structure of the titanium nitride film being deposited can be adjusted by a suitable selection of the starting compound, by modification of the R, R' radical, by variation of the parameters of the deposition process, and by adding gaseous nitrogen or ammonia. Additionally, CVD can be enhanced by use of a plasma.

The CVD titanium compound is introduced into the reaction chamber by a carrier gas, such as $H_2$, $N_2$, Ar, He, or by a vacuum process. Process gases, other than the carrier gas, such as $H_2$, $N_2$, and $NH_3$ can also be introduced into the chamber. The deposition of the titanium nitride film in the CVD process will preferably be at a temperature in a range from about 200° C. to about 500° C. using at least one of the thermally, optically or plasma-excited CVD processes.

In a preferred embodiment, $NH_3$ in place of $H_2$ is used as a reducing agent, because TiN can be produced at lower temperatures using only thermal excitation. For example, $Ti[N(CH_3)_2]_4$ can be thermally decomposed with $H_2$ and/or $NH_3$ as the reducing agent:

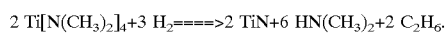

$$2\ Ti[N(CH_3)_2]_4 + 3\ H_2 = = = = > 2\ TiN + 6\ HN(CH_3)_2 + 2\ C_2H_6.$$

After deposition of barrier layer 114 with an optional underlying titanium layer (not shown), at least two aluminum alloy layers 116, 118 are deposited. The required technique is that of applying a first metal alloy that has a lower melting point than a subsequent second metal alloy. As such, there is facilitated a lower temperature flow processing that consequently does not damage the barrier layer. Although it is not desired that any single theory be adhered to, it is considered that the lower process temperatures are possible due to the melting point lowering effect that the first deposited metal has upon the second metal. Such a eutectic phenomena would allow for both the first and second metals to fuse, alloy, and flow into any void that was previously formed due to poor step coverage during the CVD or PVD metallization process.

The method uses a first metal alloy selected from a preferred group consisting of aluminum-copper and aluminum-silicon-copper. Preferably, the first metal alloy is composed of at least 95% aluminum. Other alloys are formulated by selecting from remaining elements of the Group 1B, 2B, 3A, and 4A columns of the periodic table. In selecting alloying elements such as tin or zinc to alloy with aluminum, election of a preferred alloying ratio depends upon striking a balance between achieving a melt/alloy/flow temperature, desired stress migration and electromigration properties, and on the designed current density required for the specific device. Although a desired low flow filling temperature can be achieved by addition of low melting-point elements such as tin or zinc, electrical conductivity is not as high.

The inventive method operates at a pressure in a range of about 10 atmospheres to about 750 atmospheres. Preferably, the pressure will be in a range from about 100 atmospheres to about 700 atmospheres. The temperature at which the inventive method is conducted in a range of about 300° C. to about 600° C. Preferably, the temperature will be in a range of about 400° C. to about 550° C.

The method of depositing the metallization layers within the trench, channel, or via so as to fill the same follows two alternative paths. This portion of the invention is directed to accomplishing a lower temperature trench, channel, or via filling flow after deposition in such a way as to leave the barrier layer in sound condition. In this way the device acquires qualities of robust stress resistance and electromigration resistance.

Figure 7:
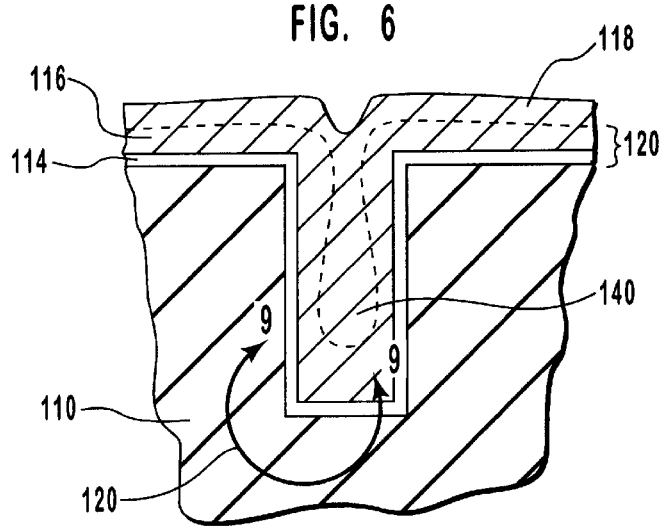

FIGS. 6 and 7 illustrate a first preferred alternative process in low-temperature trench, channel, or via filling. This first preferred alternative process for substantially complete trench, channel, or via filling is accomplished by providing a semiconductor structure 110 having therein a recess 112. Recess 112, which may be a trench, channel, or via, has side walls and a bottom. Recess 112 is typical of the topography of a semiconductor substrate where the inventive method can be employed. The inventive method is effective for a trench, channel, or via. A barrier layer 114 is deposited within recess 112 upon the side walls and bottom. A first metal alloy 116, having a first melting point, is deposited upon barrier layer 114 to form a device-barrier layer-metal composite 120. A second metal alloy 118 is deposited upon first metal alloy 116. Second metal alloy 118 has a second melting point that is at least 10° C. greater than that of first metal alloy 116. Preferably, after second metal alloy 118 is deposited upon first metal alloy 116, first metal alloy 116 and second metal alloy 118 alloy into each other. Semiconductor structure 110 is then treated to form a coherent composite 140 from first metal alloy 116 and second metal alloy 118.

First metal alloy 116 can also be several layers that are sequentially deposited. After the deposition of each layer, each layer may then be heat and/or pressure conditioned until first metal alloy 116 as seen in FIG. 6 results. Similarly, second metal alloy 118 can be several layers that are sequentially deposited. After the deposition of each such layer, each such layer may then be heat and/or pressure conditioned until second metal alloy 118 as seen in FIG. 7 results. Each layer of first metal alloy 116 will preferably have a melting point that is at least 10° C. less than the melting point of any layer of second metal alloy 118.

In preferred embodiments, the method uses a material for barrier layer 114 selected from the group consisting of titanium nitride, titanium, titanium tungsten, and titanium aluminide. In a typical preferred embodiment, barrier layer 114 is composed of TiN deposited by CVD.

First metal alloy layer 116 is composed of an aluminum alloy, is preferably composed of at least 95% aluminum, and is preferably deposited by CVD. Examples of the composition of first metal alloy layer 116 are a silicon alloy of aluminum and a tin alloy of aluminum. Another example of the composition of first metal alloy layer 116 is a germanium alloy of aluminum, where germanium is less than five percent of the composition.

Second metal alloy 118 can be a copper alloy of aluminum, a vanadium alloy of aluminum, or a silicon-copper alloy of aluminum. Second metal alloy 118 can be composed of Al—Cu or Al—Si—Cu, where the Cu composition is preferably between about 0.5% to 10%, and most preferably between 0.5% to 2% Cu. Preferably, second metal alloy layer 118 is a layer is of CVD deposited Al-0.5Cu, where second metal alloy layer 118 is deposited at pressure and heat flowing temperature such that the Al—Cu material is melted into and alloyed with the pure Al layer. As such, preferred process parameters are at a pressure in a range from about 10 atmospheres to about 750 atmospheres, and a temperature range from about 300° C. to about 600° C. Most preferably, process parameters are at a pressure in a range from about 100 atmospheres to about 700 atmospheres, and a temperature range from about 400° C. to about 550° C.

Figure 8:
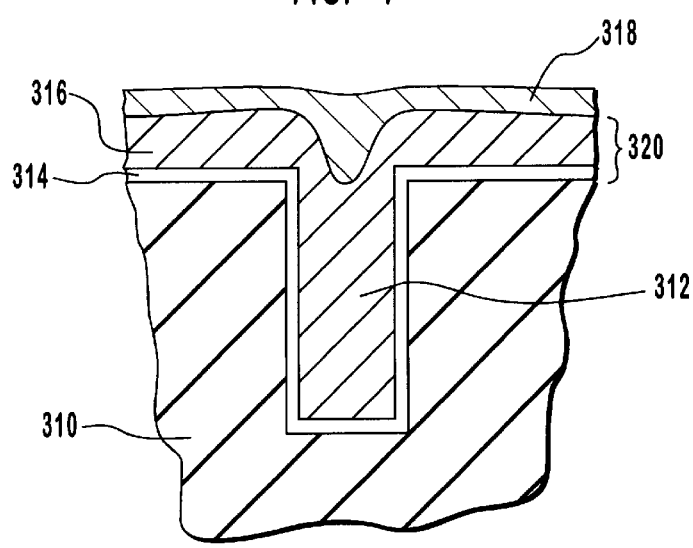

FIG. 8 illustrates a two-layer deposition in a second preferred alternative of the present invention. The second preferred alternative has a step requiring high-pressure, low-temperature trench, channel, or via filling. This technique for substantially complete trench, channel, or via filling is accomplished by providing a semiconductor structure 310 having a recess 312 therein. Recess 312, which may be a trench, channel, or via, has side walls and a bottom. Next, a barrier layer 314 is deposited on the side walls and bottom of recess 312 over and upon barrier layer 314. A first metal alloy 316 is deposited upon barrier layer 314. First metal alloy 316, which has a first melting point, with barrier layer 314 forms a device-barrier layer-metal composite 320. Semiconductor structure 310 is then treated so that device-barrier layer-metal composite 320 forms a coherent composite. A second metal alloy 318 is then deposited upon the coherent composite formed from device-barrier layer-metal composite 320. Second metal alloy 318 has a second melting point that is greater by at least 10° C. than the first melting point of the first metal alloy 316. Preferably, first metal alloy 316 and second metal alloy 318 alloy into each other.

The second preferred alternative of the present invention has a barrier layer of TiN that is deposited by CVD. The barrier layer material is selected from the group consisting of titanium nitride, titanium, titanium tungsten, and titanium aluminide. Examples of the composition of first metal alloy layer 316 are a silicon alloy of aluminum and a tin alloy of aluminum. Another example of the composition of first metal alloy layer 316 is a germanium alloy of aluminum, where germanium is less than five percent of the composition. First metal alloy layer 316 is composed of an aluminum alloy, and is preferably composed of at least 95% aluminum.

In the second preferred alternative of the present invention, second metal alloy 318 can be a layer of an aluminum alloy, such as an aluminum alloy of copper, vanadium, or silicon-copper, but is preferably Al—Cu or Al—Si—Cu, where second metal alloy 318 is most preferably Al—Cu having between 0.5% to 2% Cu. Second metal alloy 318 can be deposited by CVD at a pressure and heat flowing on the aluminum alloy layer under the conditions of a pressure in a range from about 10 atmospheres to about 750 atmospheres, and a temperature range from about 300° C. to about 600° C. Most preferably, process parameters are at a pressure in a range from about 100 atmospheres to about 700 atmospheres, and a temperature range from about 400° C. to about 550° C.

Selection of preferred alloying ratios of the aluminum alloys depend upon striking a desired balance between achieving a desired melt/alloy/flow temperature, desired stress properties and electromigration properties, and the designed current density required for the specific device.

Figure 1:
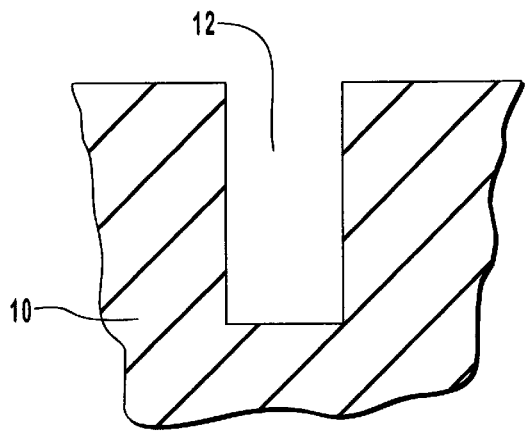
Figure 2:
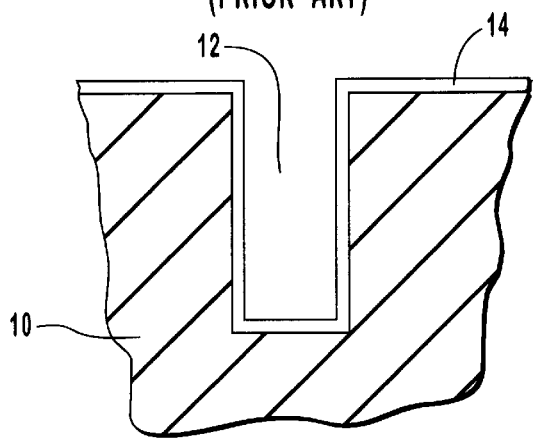
Figure 3:
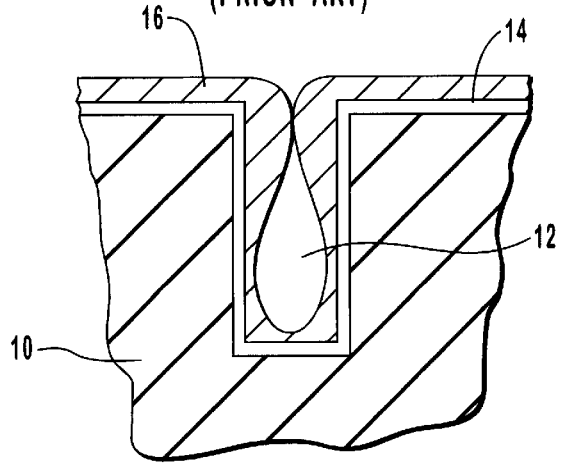
Figure 4:
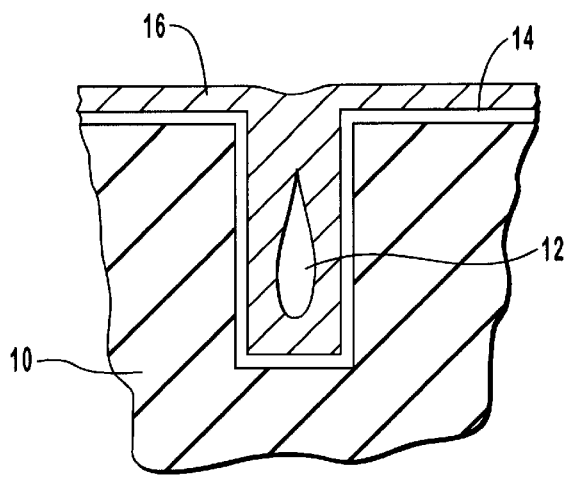
Figure 5:
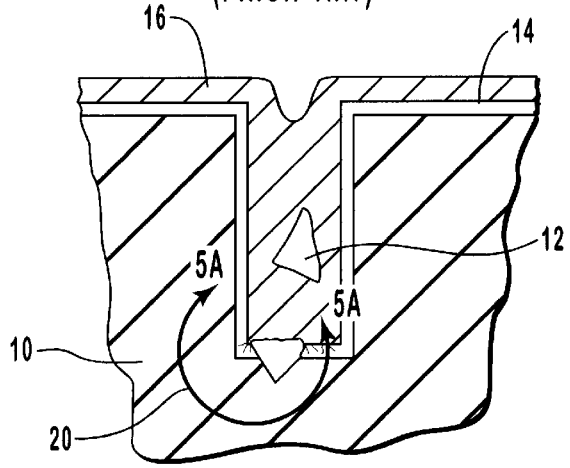
Figure 5A:
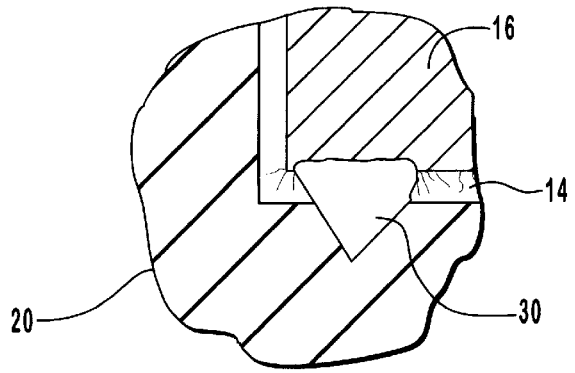
Figure 9:
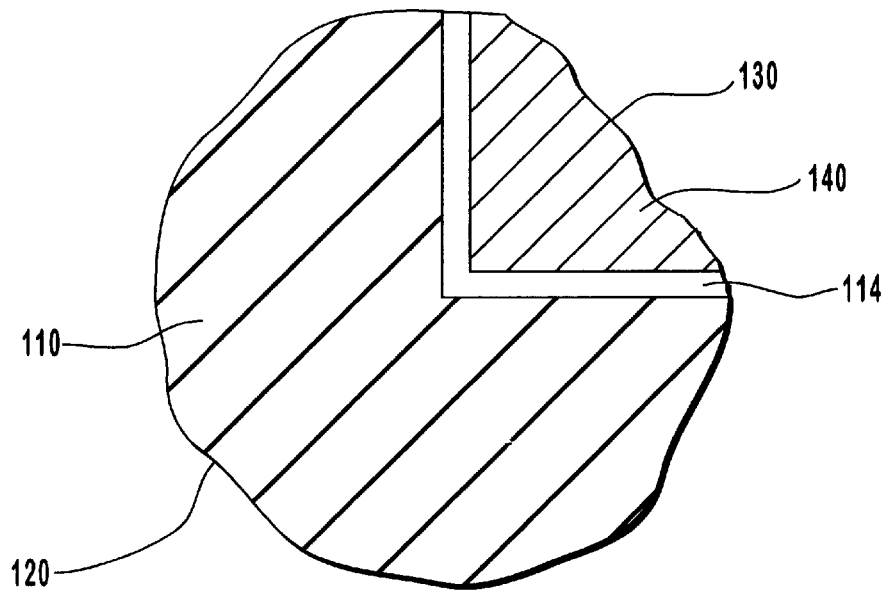
FIG. 9 is an enlarged view of a section of FIG. 7.

FIG. 9 is presented to illustrate a comparison between an intact barrier layer 114 achieved in the present invention and the damage to barrier layer 114 in FIG. 5A.

Figure 10:
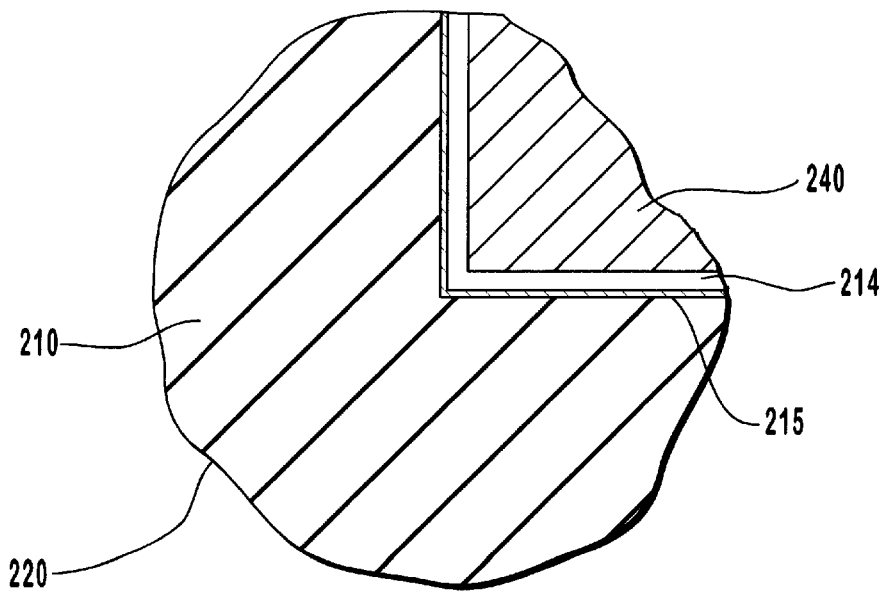
FIG. 10 is a structure resulting from a second preferred alternative embodiment of the inventive method and illustrates an enlarged of a section the resultant structure wherein a contact layer is deposited before the deposition of the barrier layer.

FIG. 10 illustrates a structure that results from an alternative embodiment of the inventive method of the present invention. A portion of a recess, which may be a trench, channel, or via, is seen in FIG. 10 within a silicon region 210 circumscribing the recess. For improving the electrical contact with underlying silicon region 210, a titanium layer 215 is applied as a contact layer to the sidewall and bottom of the recess. Titanium layer 215 is deposited within the recess by known CVD or PVD methods. All steps subsequent to the deposition of titanium layer 215 are as described above. As such, the structure illustrated in FIG. 10 differs from the structure illustrated in FIG. 9 only in titanium layer 215. The deposition of titanium layer 215 will preferably be by a CVD process at a pressure range of about 100 atmospheres to about 750 atmospheres, and at a temperature range from about 300° C. to about 600° C. An excitation with a plasma in the CVD process can additionally be provided. Titanium layer 215 simultaneously serves as an adhesion layer for barrier layer 214, preferably composed of titanium nitride, and as a contact layer. A coherent composite layer 240, situated on barrier layer 214, is formed as was coherent composite 140 seen in FIG. 7 and FIG. 9.

While this invention has been described in terms of the above specific embodiments, those skilled in the art will recognize that the invention can be practiced with modifications within the spirit and scope of the appended claims and whole or partial combinations thereof, i.e. that changes can be made in form and detail, without departing from the spirit and scope of the invention. Accordingly all such changes come within the purview of the present invention and the invention encompasses the subject matter of the claims which follow. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A recess filling method comprising:
  providing a semiconductor substrate having a recess therein, said recess having an opening thereto;
  forming a barrier layer within said recess;
  forming a first metal layer upon said barrier layer, said first metal layer being formed of a metal or metal alloy that is selected to have a first melting point that is sufficiently low to not damage the barrier layer;
  filling up the recess with the first metal layer by exposing the semiconductor substrate to a selected pressure and a selected temperature until the first metal layer closes the opening to the recess and the recess has a void therein;
  forming a second metal layer upon said first metal layer, said second metal layer having a second melting point that is at least 10° C. greater than the first melting point of said first metal layer, said second metal layer being formed of a metal or metal alloy that is selected to have desired stress migration and electromigration properties; and
  heating and pressuring the first and second metal layers until the first and second metal layers fill the void in the recess.

2. A method according to claim 1, wherein said second metal layer is composed of Al—Cu and contains between about 0.5% to about 10% Cu.

3. A method according to claim 1, wherein the selected pressure is in a range from about 10 atmospheres to about 750 atmospheres.

4. A method according to claim 1, wherein heating and pressuring the first and second metal layers further comprises alloying the first metal layer with the second metal layer.

5. A method according to claim 1, wherein said barrier layer is composed of a material selected from the group consisting of titanium nitride, titanium, titanium tungsten, and titanium aluminide.

6. A method according to claim 1, wherein said second metal layer is an aluminum alloy wherein the alloying elements of said aluminum alloy are selected from the group consisting of elements of the Group 1B, 2B, 3A, and 4A columns of the periodic table and combinations thereof.

7. A method according to claim 5, wherein said second metal layer is composed of Al—Cu and contains between about 0.5% to about 10% Cu.

8. A method according to claim 7, wherein said selected pressure is in a range from about 10 atmospheres to about 750 atmospheres, and said selected temperature is in a range from about 300° C. to about 600° C.

9. A method according to claim 8, wherein said recess has side walls and a bottom, said method further comprising, prior to forming said barrier layer within said recess, depositing a titanium layer upon the side walls and bottom of said recess said titanium layer.

10. A method according to claim 6, wherein said second metal layer is composed of a material selected from the group consisting of aluminum-copper and aluminum-silicon-copper.

11. A recess filling method comprising:
  providing a semiconductor substrate having a recess therein, said recess having an opening thereto,
  forming a barrier layer within said recess;
  forming a first metal layer upon said barrier layer until the first metal layer closes the opening to the recess and the recess has a void therein, said first metal layer being formed of a metal or metal alloy that is selected to have a first melting point that is sufficiently low to not damage the barrier layer;
  forming a second metal layer upon said first metal layer, said second metal layer having a second melting point that is at least 10° C. greater than the first melting point of said first metal layer, said second metal layer being formed of a metal or metal alloy that is selected to have desired stress migration and electromigration properties; and filling the void and said recess with said first and second metal layers by exposing said semiconductor substrate to a pressure m a range from about 10 atmospheres to about 750 atmospheres, and a temperature in a range from about 300° C. to about 600° C.

12. A method according to claim 11, wherein said second metal layer is composed of Al—Cu and contains between about 0.5% to about 10% Cu.

13. A method according to claim 11, wherein the selected pressure is in a range from about 100 atmospheres to about 700 atmospheres.

14. A method according to claim 11, wherein filling the void and said recess further comprises alloying the first layer with the second metal layer.

15. A method according to claim 11, wherein said barrier layer is composed of a material selected from the group consisting of titanium nitride, titanium, titanium tungsten, and titanium aluminide.

16. A method according to claim 11, wherein said second metal layer is an aluminum alloy wherein the alloying elements of said aluminum alloy are selected from the group consisting of elements of the Group 1B, 2B, 3A, and 4A columns of the periodic table and combinations thereof.

17. A method according to claim 15, wherein said second metal layer composed of Al—Cu and contains between about 0.5% to about 10% Cu.

18. A method according to claim 17, wherein said a pressure is about 100 atmospheres to about 700 atmospheres and said temperature is in a range from about 400° C. to about 550° C.

19. A method according to claim 18, wherein said recess has side walls and a bottom, said method further comprising, prior to forming said barrier layer within said recess, depositing a titanium layer upon the side walls and bottom of said recess said titanium layer.

20. A method according to claim 16, wherein said second metal layer is composed of a material selected from the group consisting of aluminum-copper and aluminum-silicon-copper.

21. A recess filling method comprising:

providing a semiconductor substrate having a recess, said recess having an opening thereto;

depositing a barrier layer within said recess, said barrier layer being composed of a material selected from the group consisting of titanium nitride, titanium, titanium tungsten, and titanium aluminide;

depositing a first metal layer upon said barrier layer until the first metal layer closes the opening to the recess leaving a void therein by exposing said semiconductor substrate to a pressure in a range of about 10 atmospheres to about 750 atmospheres, and a temperature is about 300° C. to about 600° C., said first metal layer being formed of a metal or metal alloy that is selected to have a first melting point that is sufficiently low to not damage the barrier layer; and depositing a second metal layer upon said first metal layer to fill the void and the recess with the first and second metal layers, wherein said second metal layer is composed of Al—Cu and contains between about 0.5% to about 10% Cu, and wherein said second metal layer has a second melting point that is at least 10° C. greater than the first melting point of said first metal layer, said second metal layer being formed of a metal or metal alloy that is selected to have desired stress migration and electromigration properties.

22. A method according to claim 21, wherein depositing said second metal layer upon said first metal layer to fill the void and the recess with the first and second metal layers further comprises alloying the first metal layer with the second metal layer.

23. A method according to claim 21, wherein said second metal layer is composed of a material selected from the group consisting of aluminum-copper and aluminum-silicon-copper.

24. A method according to claim 21, wherein said recess has side walls and a bottom, said method further comprising, prior to depositing said barrier layer within said recess, depositing a titanium layer upon the side walls and bottom of said recess.

25. A method according to claim 24, wherein said pressure is in a range of about 100 atmospheres and about 700 atmospheres, and a temperature is about 400° C. to about 550° C.

26. A recess filling method comprising:

providing a semiconductor substrate having a recess, said recess having an opening thereto;

depositing a barrier layer within said recess, said barrier layer being composed of a material selected from the group consisting of titanium nitride, titanium, titanium tungsten, and titanium aluminide;

depositing a first metal layer upon said barrier layer until the first metal layer closes the opening to the recess leaving a void therein, said first metal layer being composed of an aluminum alloy that is selected to have a first melting point that is sufficiently low to not damage the barrier layer;

depositing a second metal layer upon said first metal layer, said second metal layer having a second melting point that is at least 10° C. greater than the first melting point of said first metal layer, wherein said second metal layer composed of Al—Cu and contains between about 0.5% to about 10% Cu; and filling up said recess and the void with said first and second metal layers by exposing said semiconductor substrate to a pressure is in a range of about 10 atmospheres and about 750 atmospheres, and a temperature in a range of about 300° C. to about 600° C.

27. A method according to claim 26, wherein said second metal layer is composed of a material selected from the group consisting of aluminum-copper and aluminum-silicon-copper.

28. A method according to claim 26, wherein said recess has side walls and a bottom, said method further comprising, prior to depositing said barrier layer within said recess, depositing a titanium layer upon the side walls and bottom of said recess.

29. A method according to claim 28, wherein said pressure is in a range of about 100 atmospheres and about 700 atmospheres, and a temperature in a range of about 400° C. to about 550°.

30. A method according to claim 28, wherein said pressure is in a range of about 100 atmospheres and about 700 atmospheres, and a temperature in a range of about 400° C. to about 550°.

31. A recess filling method comprising:

providing a semiconductor substrate having a recess with an opening thereto, side walls, and a bottom;

depositing a titanium layer upon the side walls and bottom of said recess;

depositing a barrier layer upon said titanium layer, said barrier layer being composed of a material selected from the group consisting of titanium nitride, titanium, titanium tungsten, and titanium aluminide;

depositing a first metal layer upon said barrier layer until the first metal layer closes the opening to the recess leaving a void therein, said first metal layer being composed of an aluminum alloy that is selected to have a first melting point that is sufficiently low to not damage the barrier layer;

depositing a second metal layer upon said first metal layer, said second metal layer having a second melting point that is at least 10° C. greater than the first melting point of said first metal layer, wherein said second metal layer composed of material selected from the group consisting of aluminum-copper and aluminum-silicon-copper, said material containing between about 0.5% to about 10% Cu, said second metal layer being formed of a metal or metal alloy that is selected to have desired stress migration and electromigration properties; and filling up said recess and the void with said first and second metal layers by exposing said semiconductor substrate to a pressure is in a range of about 10 atmospheres and about 750 atmospheres, and a temperature in a range of about 300° C. to about 600° C.

32. A recess filling method comprising:

providing a semiconductor substrate having a recess with an opening thereto;

depositing a barrier layer within said recess;

depositing a plurality of first metal layers over said barrier layer;

filling up said recess with said plurality of first metal layers by exposing said semiconductor substrate to a selected pressure and a selected temperature, wherein said plurality of first metal layer close the opening to the recess leaving a void therein; and depositing at least one second metal layer upon said plurality of first metal layers so as to fill up the recess and the void with said plurality of first metal layers and with said at least one second metal layer, each second having a melting point, each first metal layer having a melting point that is at least 10° C. less than the melting point of each second metal layer, said at least one second metal layer being formed of a metal or metal alloy that is selected to have the desired stress migration and electromigration properties.

33. A method according to claim 32, wherein said first metal layers are composed of at least 95% aluminum.

34. A method according to claim 32, wherein said barrier layer is composed of a material selected from the group consisting of titanium nitride, titanium, titanium tungsten, and titanium aluminide.

35. A method according to claim 34, wherein said second metal layer composed of Al—Cu and contains between about 0.5% to about 10% Cu.

36. A method according to claim 35, wherein said recess has side walls and a bottom, said method further comprising, prior to depositing said barrier layer within said recess, of depositing a titanium layer upon the side walls and bottom of said recess.

37. A recess filling method comprising:

providing a semiconductor substrate having a recess with an opening thereto, a side wall, and a bottom;

depositing a titanium layer by a CVD process upon the side walls and bottom of said recess;

depositing a barrier layer by a CVD process within said recess;

depositing over said barrier layer a plurality of first metal layers each being composed of at least 95% aluminum, said plurality of first metal layers being formed of one or more metals or metal alloys that are selected to have a first melting point that is sufficiently low to not damage the barrier layer;

filling up said recess with said plurality of first metal layers by exposing said semiconductor substrate to a pressure in a range from about 100 atmospheres to about 700 atmospheres and a temperature in a range of about 400° C. to about 550° C., wherein said plurality of first metal layers close the opening to the recess leaving a void therein; and depositing at least one second metal layer upon said plurality of first metal layers so as to fill up the recess and the void with said plurality of first metal layers and with said at least one second metal layer, each said at least one second metal layer having a melting point, and each said first metal layer having a melting point that is at least 10° C. less than the melting point of each said at least one second metal layer.

38. A recess filling method comprising:

providing a semiconductor substrate having a recess therein, said recess having an opening thereto;

forming a barrier layer within said recess, wherein said barrier layer is composed of a material selected from the group consisting of titanium nitride, titanium, titanium tungsten, and titanium aluminide;

forming a first metal layer upon said barrier layer, wherein said first metal layer closes the opening to the recess leaving a void therein, said first metal layer being composed of a material selected from the group consisting of a silicon alloy of aluminum, a germanium alloy of aluminum, and a tin alloy of aluminum, said first metal layer being formed of a metal or metal alloy that is selected to have a first melting point that is sufficiently low to not damage the barrier layer;

filling up the recess with the first metal layer by exposing the semiconductor substrate to a selected pressure and a selected temperature, wherein said first metal layer closes the opening to the recess leaving a void therein; and forming a second metal layer upon said first metal layer so as to fill up the recess and the void with said first and second metal layers, said second metal layer being composed of a material selected from the group consisting of a copper alloy of aluminum, a vanadium alloy of aluminum, and a silicon-copper alloy of aluminum, said second metal layer having a second melting point that is at least 10° C. greater than the first melting point of said first metal layer, said second metal layer being formed of a metal or metal alloy that is selected to have desired stress migration and electromigration properties.

39. A method according to claim 38, wherein forming the second metal layer upon the first metal layer further comprises:

alloying said first metal layer and said second metal layer one into the other.

40. A method according to claim 38, wherein said first metal layer is composed of at least 95% aluminum.

41. A recess filling method comprising:

providing a semiconductor substrate having a recess therein, said recess having an opening thereto;

forming a barrier layer within said recess;

forming a first metal layer having a first melting point upon said barrier layer;

filling up the recess with the first metal layer by exposing the semiconductor substrate to a selected pressure and a selected temperature, wherein said first metal layer closes the opening to the recess leaving a void therein; and forming a second metal layer upon said first metal layer so as to fill up the recess and the void with said first and second metal layers, said second metal layer having a second melting point that is greater than the first melting point of said first metal layer, said second metal layer being formed of a metal or metal alloy that is selected to have desired stress migration and electromigration properties.

42. A recess filling method comprising:

providing a semiconductor substrate having a recess with an opening thereto, side walls, and a bottom;

depositing a titanium layer upon the side walls and bottom of said recess;

depositing a barrier layer upon said titanium layer, said barrier layer being composed of a material selected from the group consisting of titanium nitride, titanium, titanium tungsten, and titanium aluminide;

depositing a first metal layer upon said barrier layer, said first metal layer being composed of an aluminum alloy, wherein said first metal layer closes the opening to the recess leaving a void therein, said first metal layer being formed of a metal or metal alloy that is selected to have a first melting point that is sufficiently low to not damage the barrier layer;

depositing a second metal layer upon said first metal layer, said second metal layer having a second melting point that is greater than the first melting point of said first metal layer, wherein said second metal layer composed of material selected from the group consisting of aluminum-copper and aluminum-silicon-copper, said material containing between about 0.5% to about 10% Cu; and filling up the void and said recess with said first and second metal layers by exposing said semiconductor substrate to a pressure is in a range of about 10 atmospheres and about 750 atmospheres, and a temperature in a range of about 300° C. to about 600° C.

43. a recess filling method comprising:

providing a semiconductor substrate having a recess, said recess having an opening thereto;

depositing a barrier layer within said recess;

deposing a plurality of first metal layers over said barrier layer;

filling up said recess with said plurality of first metal layers by exposing said semiconductor substrate to a selected pressure and a selected temperature, wherein said plurality of first metal layers close the opening to the recess leaving a void therein; and depositing at least one second metal layer upon said plurality of first metal layers so as to fill recess and the void, each second metal layer having a melting point, each first metal layer having a melting point that is less than the melting point of said at least one second metal layer, said at least one second metal layer being formed of a metal or metal alloy that is selected to have desired stress migration and electromigration properties.

44. A recess filling method comprising:

providing a semiconductor substrate having a recess with an opening thereto, a side wall, and a bottom;

depositing a titanium layer by a CVD process upon the side walls and bottom of said recess;

depositing a barrier layer by a CVD process within said recess;

depositing a plurality of first metal layers over said barrier layer, each said first metal layer being composed of at least 95% aluminum;

filling up said recess with said plurality of first metal layers by exposing said semiconductor substrate to a pressure in a range from about 100 atmospheres to about 700 atmospheres and a temperature in a range of about 400° C. to about 550° C., wherein the plurality of first metal layers closes the opening to the recess and the recess has a void therein; and depositing at least one second metal layer upon said plurality of first metal layers so as to fill the recess and the void, each said at least one second metal layer having a melting point, each said first metal layer having a melting point that is less than the melting point of each said at least one second metal layer, said at least one second metal layer being formed of a metal or metal alloy that is selected to have desired stress migration and electromigration properties.

45. A recess filling method comprising:

providing a semiconductor substrate having a recess therein, said recess having an opening thereto;

forming a barrier layer within said recess, wherein said barrier layer is composed of a material selected from the group consisting of titanium nitride, titanium, titanium tungsten, and titanium aluminide;

forming a first metal layer upon said barrier layer, said first metal layer being composed of a material selected from the group consisting of a silicon alloy of aluminum, a germanium alloy of aluminum, and a tin alloy of aluminum, said first metal layer being formed of a metal or metal alloy that is selected to have a first melting point that is sufficiently low to not damage the barrier layer;

filling up the recess with the first metal layer by exposing the semiconductor substrate to a selected pressure and a selected temperature, wherein the first metal layer closes the opening to the recess and the recess has a void therein; and forming a second metal layer upon said first metal layer so as to fill the recess and the void, said second metal layer being composed of a material selected from the group consisting of a copper alloy of aluminum, a vanadium alloy of aluminum, and a silicon-copper alloy of aluminum, said second metal layer having a second melting point that is greater than the first melting point of said first metal layer.

* * * * *

UNITED STATES PATENT AND TRADEMARK OFFICE
CERTIFICATE OF CORRECTION

PATENT NO. : 6,376,369 B1  
DATED : April 23, 2002  
INVENTOR(S) : Trung T. Doan It is certified that error appears in the above-identified patent and that said Letters Patent is hereby corrected as shown below:

<u>Column 9,</u>
Line 8, after "pressure" change "m" to -- in --

Signed and Sealed this

Eleventh Day of February, 2003

JAMES E. ROGAN
*Director of the United States Patent and Trademark Office*